United States Patent [19]

Partridge

[11] 3,995,299

[45] Nov. 30, 1976

[54] RADIATION SOURCES

[75] Inventor: Roger Hugh Partridge, Walton-on-Thames, England

[73] Assignee: The Secretary of State for Industry in Her Britannic Majesty's Government of the United Kingdom of Great Britain and Northern Ireland, London, England

[22] Filed: Oct. 7, 1975

[21] Appl. No.: 620,450

[30] Foreign Application Priority Data

Oct. 15, 1974 United Kingdom .............. 44704/74

[52] U.S. Cl. ........................................ 357/8; 357/2; 357/61; 428/515; 252/511; 313/498; 313/504; 526/4

[51] Int. Cl.² .......................................... H01L 29/28

[58] Field of Search .............. 357/8, 61, 2; 313/498, 313/504, 503; 526/4; 428/515; 252/511, 518

[56] References Cited

UNITED STATES PATENTS

| | | | |
|---|---|---|---|
| 3,403,165 | 9/1968 | Matsunaga | 260/327 |
| 3,449,329 | 6/1969 | Wildi | 260/240 |
| 3,530,325 | 9/1970 | Mehl | 313/108 |
| 3,621,321 | 11/1971 | Williams | 313/108 A |
| 3,634,336 | 1/1972 | Perezabuerne | 252/519 |
| 3,654,525 | 4/1972 | Maricle | 317/230 |
| 3,775,177 | 11/1973 | Hayama | 117/230 |

*Primary Examiner*—Martin H. Edlow
*Attorney, Agent, or Firm*—Pollock, VandeSande & Priddy

[57] ABSTRACT

A radiation source comprising a lamina of amorphous or predominantly amorphous polymer material having appreciable electrical charge mobility and a low ionization potential; a strong electron donor; a strong electron acceptor; and preferably at least one fluorescent additive; electrical connections being provided by which an electric current may be passed through the thickness of said lamina to excite radiation therefrom.

13 Claims, 1 Drawing Figure

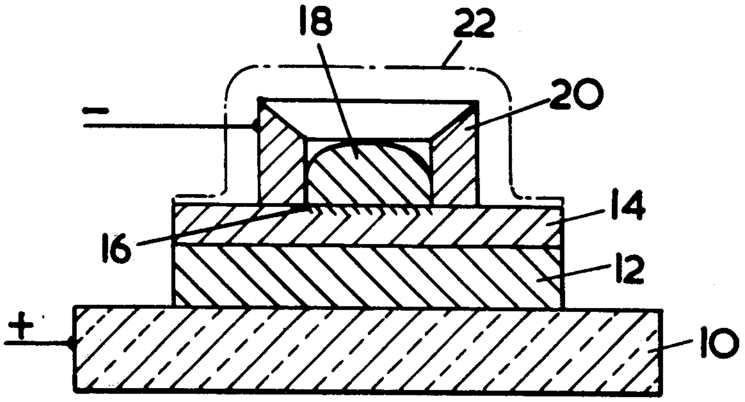
18
22
20
−
14
16
12
+
10

RADIATION SOURCES

The invention relates to radiation sources, more especially, but not exclusively, of the kind known as light emitting diodes (commonly abbreviated to LED).

LED light sources are commonly made from inorganic semiconductor material such as gallium phosphide or gallium phosphide arsenide. However, such materials are expensive to synthesise, being usually required in mono-crystalline form and of a high degree of purity. Experimental LED's have also been made with organic crystal material, for example, anthracene, but these are still likely to be expensive.

The present invention provided a radiation source which is an LED or which operates on rather similar physical principles to an LED and which can be made at much lower cost than conventional LED's and in which the colour of emitted light can be predetermined with an apprecialy range of choice; some colours being obtainable which are not readily obtained — if obtainable at all — with conventional semiconductor LED's.

In this specification the term "luminescent" includes "fluorescent" and "phosphorescent."

According to the invention in its broadest form there is provided a radiation source comprising a lamina of amorphous, or predominately amorphous, polymer material having appreciable electrical charge mobility, and a low ionization potential; a strong electron donor; a strong electron acceptor; and preferably at least one luminescent additive; electrical connections being provided by which an electric current may be passed through the thickness of said lamina to excite radiation therefrom.

According to one desirable form of the invention the lamina is a thin translucent film of at least predominantly amorphous polymer material, which includes at least one luminescent additive, and which has a sufficiently high electron affinity to allow anion formation; the strong electron donor is in contact with one side of said polymer film and at least in part is in a first electrically conducting layer which is an anion layer formed by reacting the electron donor with the said polymer, the electron donor being strong enough to allow at least virtually complete transfer of an electron to at least one of said polymer and additive; the strong electron acceptor is in contact with the other side of said polymer film and is in a second electrically conducting layer which is a cation layer formed by reacting the electron acceptor with the said polymer, the electron acceptor being strong enough to allow at least virtually complete extraction of an electron from at least one of the polymer and additive; at least one of the said electrically conducting layers being translucent and at least one of said anion layer and cation layer being a charge injector layer relative to the polymer material; whereby when in use an electric current is passed in an appropriate sense through the electrically conducting layers and polymer film in series, light is emitted from the said radiation source.

Desirably the said amorphous polymer material has a high efficiency of transfer of excitation energy from the polymer to a luminescent additive.

Some luminescent additives which may be used are perylene, tetraphenylbutadiene, acridine orange. Such additives may be used each alone; or more than one may be used in a radiation source. Energy may be transferred from one luminescent additive to another luminescent additive.

The electron donor is preferably an alkali metal, which may be potassium, rubidium or caesium, in intimate contact with the thin translucent film.

The electron acceptor is desirably a metal salt or other electron acceptor of sufficient strength at least virtually completely to remove an electron from the polymer.

The metal salt may be, for example, antimony pentachloride.

The amorphous polymer material of the thin translucent film may be, for example, polyvinyl carbazole, of thickness in the range from about ½ to about 1.5 micrometer. More especially when the electron donor is an alkali metal the radiation source is provided with chemically inert surroundings.

The invention will be further described, by way of example only, with reference to the drawing filed herewith, which illustrates in sectional elevation a light emitting diode (LED).

An LED according to the invention may be built up on a plate of translucent electrically conducting glass, referenced 10 in the accompanying drawing, the glass plate serving conveniently as one electrical connection to the LED. Suitable material for the glass plate is available commercially, for example, under the name "Baltracon" (RTM). On the glass plate 10 and in electrical contact therewith is arranged a layer 12 of an intimate mixture consisting of polyvinyl carbazole and antimony pentachloride in the proportion of about 4 to 1. This mixture has the property of being a positive charge injector relative to polyvinyl carbazole. It is translucent and has a greenish colour in the thickness employed, which is not critical but for convenience is in the range from about 1 to about 2 micrometer. Next to the layer 12 is a film 14 of transparent and at least predominantly amorphous-polymer material including a luminescent additive; in this particular example the polymer material is polyvinyl carbazole and the luminescent additive perylene. The film desirably has a thickness in the range ½ to about 1½ micrometer.

On the other side of the film 14 is a layer 16 which has the property of being a negative charge injector. This layer is formed by pouring onto the surface of the film 14 a quantity 18 of cesium which has a melting point only a little above the usual room temperature, viz. 28.5° C. The cesium donates electrons to the polyvinyl carbazole of the film 14 forming polymer anions and may also form additive ions in the same way, so constituting an anion electrode layer. In this particular embodiment the anion layer injects little charge into the layer 14, but with other polymer materials charge injection into such layer may be very appreciable. After pouring, the cesium solidifies, but to localise it while in the liquid state it is poured into a small brass ring 20. The brass ring also serves as a convenient electrical connection, through the mass 18 of cesium, to the negative charge injector layer 16.

In order to prevent accidental chemical reaction of the cesium, eg oxidation, chemically inert surroundings are provided within an enclosure, indicated diagrammatically at 22. Dry nitrogen is a suitably inert substance with which such enclosure may be filled.

In use an electric current is passed through the LED, the glass plate being the anode and the brass ring the cathode; the LED being forward biassed, light is then generated, the colour of the light being predominantly blue-green with the particular luminescent additive perylene. The light emerges through the conducting glass. If the electrical polarity is reversed, substantially no light is observed; an appreciable current still flows, but smaller than the current with forward biassed polarity, for the same applied voltage.

The invention has been exemplified by a film of polyvinylcarbazole with perylene as the luminescent additive. It may be noted that the polymer layer in the LED conducts electricity only because electric charges are injected into it from one or other or both of the anion layer and the cation layer. In the absence of such injection such polymer layers are generally good insulators. Other polymer materials may be used provided they possess certain properties of polyvinylcarbazole, viz a low ionization potential (to allow cation formation); a sufficiently high electron affinity in the solid phase (to allow anion formation); and a sufficient charge carrier mobility (about $10^{-8}cm^2Vs$ or higher) for positive and/or negative charges. Further desirable properties are high luminescent efficiency or high efficiency of transfer of excitation energy to any luminescent additive, and the ability to form good quality films of reasonable mechanical strength. Other luminescent additives than perylene may be employed; for example, tetraphenylbutadiene, and acridine orange. Tetraphenylbutadiene and acridine orange, for example, may be employed together to give an emission which is almost white. In general, emmission colour can be selected by using additives in different combinations and concentrations, provided all can accept excitation from the amorphous film polymer or another additive and can be incorporated into the radiation source without chemical decomposition.

Other alkali metals than cesium may be used to form the electron donor layer, for example, potassium or rubidium. Operation in inert surroundings will be required, in any case, for the avoidance of unwanted chemical reactions with the alkali metal. In the cation layer antimony pentachloride may be replaced, for example, by aluminium chloride ($Al\ Cl_3$), but this has been found to be less satisfactory than the antimony compound through difficulty in forming the layer.

The invention has been exemplified by a device in which the amorphous polymer material contains one or more luminescent additives; luminescence may be produced with some polymers even if no additive is present, and the colour of the radiation is then fixed by the nature of the polymer instead of being a matter of choice as explained above. In another embodiment of the invention the separate film of amorphous polymer may be considered as being reduced to vanishing thickness and the two different electrically conducting layers are then in direct contact, providing a two-layer device which operates on a voltage comparable with that for many conventional semiconductor devices. Any luminescent additive must then be present in one or both of the electrically conducting layers.

In a further embodiment, the two electrically conducting layers are actually mixed, forming a single layer device. The single combined layer consists of a large number of very small diodes, randomly orientated, where a small portion of one injecting layer is in close proximity with a small portion of the other. Such a single layer device could be made to operate by the application of an alternating voltage since substantially equal numbers of the very small diodes will be orientated in opposite senses through the thickness of the layer.

I claim:

1. A radiation source comprising a lamina of amorphous, or predominantly amorphous, polymer material having appreciable electrical charge mobility, and a low ionization potential; a strong electron donor; a strong electron acceptor, and electrical connections by which an electric current may be passed through the thickness of said lamina to excite radiation from said radiation source.

2. A radiation source according to claim 1 having in the said polymer material at least one luminescent additive.

3. A radiation source according to claim 2 in which the lamina is a thin translucent film of at least predominantly amorphous polymer material, which has sufficiently high electron affinity to allow anion formation; the strong electron donor is in contact with one side of said polymer film and at least in part is in a first electrically conducting layer which is an anion layer formed by reacting the electron donor with the said polymer, the electron donor being strong enough to allow at least virtually complete transfer of an electron to at least one of said polymer and additive; the strong electron acceptor is in contact with the other side of said polymer film and is in a second electrically conducting layer which is a cation layer formed by reacting the electron acceptor with the said polymer, the electron acceptor being strong enough to allow at least virtually complete extraction of an electron from at least one of the polymer and additive; at least one of said electrically conducting layers being translucent and at least one of said anion layer and cation layer being a charge injector layer relative to the polymer material; whereby when in use an electric current is passed in an approrpiate sense through the electrically conducting layers and polymer film in series, light is emitted from the said radiation source.

4. A radiation source according to claim 2 in which there is high efficiency of transfer of excitation energy from the polymer to a luminescent additive.

5. A radiation source according to claim 2 in which excitation energy is transferred from one luminescent additive to another luminescent additive.

6. A radiation source according to claim 2 in which any luminescent additive is selected from the group consisting of perylene, tetraphenylbutadiene, acridine orange.

7. A radiation source according to claim 2 in which the electron donor is an alkali metal.

8. A radiation source according to claim 7 in which the alkali metal is one of the group consisting of potassium, rubidium, cesium.

9. A radiation source according to claim 2 in which the electron acceptor is a metal salt.

10. A radiation source according to claim 9 in which the metal salt is antimony pentachloride.

11. A radiation source according to claim 2 in which the polymer material is polyvinylcarbazole.

12. A radiation source according to claim 3 in which the polymer film is polyvinylcarbazole and has a thickness in the range from about ½ to about 1½ micrometer.

13. A radiation source according to claim 1 provided with chemically inert surroundings.

* * * * *